United States Patent
Ohnishi et al.

(10) Patent No.: US 6,687,894 B2
(45) Date of Patent: Feb. 3, 2004

(54) HIGH-LEVEL SYNTHESIS METHOD, HIGH-LEVEL SYNTHESIS APPARATUS, METHOD FOR PRODUCING LOGIC CIRCUIT USING THE HIGH-LEVEL SYNTHESIS METHOD FOR LOGIC CIRCUIT DESIGN, AND RECORDING MEDIUM

(75) Inventors: Mitsuhisa Ohnishi, Tenri (JP); Shinichi Tanaka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 79 days.

(21) Appl. No.: 09/984,897

(22) Filed: Oct. 31, 2001

(65) Prior Publication Data

US 2002/0053069 A1 May 2, 2002

(30) Foreign Application Priority Data

Oct. 31, 2000 (JP) ........................................ 2000-334017

(51) Int. Cl.$^7$ .............................................. G06F 17/50
(52) U.S. Cl. .............................. 716/18; 716/1; 716/2; 716/3; 703/14; 703/15; 703/16
(58) Field of Search ...................... 716/18, 1–3; 703/14, 703/15, 16

(56) References Cited

U.S. PATENT DOCUMENTS

| | | | | |
|---|---|---|---|---|
| 6,169,968 | B1 | * | 1/2001 | Kabuo ........................... 703/14 |
| 6,199,031 | B1 | * | 3/2001 | Challier et al. ................ 703/14 |
| 6,216,252 | B1 | * | 4/2001 | Dangelo et al. ................ 716/1 |
| 6,460,174 | B1 | * | 10/2002 | Carey ........................... 716/18 |
| 6,536,012 | B1 | * | 3/2003 | Mizuno ........................... 716/1 |
| 2002/0038401 | A1 | * | 3/2002 | Zaidi et al. ................... 710/305 |
| 2002/0166098 | A1 | * | 11/2002 | Chang et al. .................... 716/1 |

FOREIGN PATENT DOCUMENTS

| | | |
|---|---|---|
| EP | 0 829 812 A | 3/1998 |
| JP | 10-116302 | 5/1998 |

OTHER PUBLICATIONS

Page, "Constructing Hardware–Software Systems from a Single Description," *Journal of VLSI Signal Processing Systems for Signal, Image, and Video Technology,* Jan. 1996, pp. 87–107, vol. 12, No. 1.
Yamada et al., "Hardware Synthesis with the Bach System," *Proceedings of the IEEE International Symposium,* May 30, 1999, pp. 366–369.
Fischer et al., "Tool support for hardware/software co–design of communication protocols," *Computer Communications,* Jul. 2000, pp. 1158–1168, vol. 23, No. 12.
Gerstlauer et al., *Design of a GSM Vocoder using SpecC Methodology,* Technical Report ICS–99–11, Feb. 26, 1999, 76 pages.
Dömer, *System–level Modeling and Design with the SpecC Methodology,* Dissertation, 2000, 212 pages.
Sakurai et al., "Scheduling Method for Synchronous Communication in the Bach Hardware Computer," *Proceedings of the ASP–DAC '99,* Jan. 18, 1999, pp. 193–196.
Nishida et al.: The Institute of Electronics, Information and Communication Engineers, pp. 143–148 (Oct. 1997).
Yamada et al.: Environment for LSI Design with C Language, The 11$^{th}$ Workshop on Circuits and Systems pp. 468–474 Apr. 20–21, 1998.

* cited by examiner

Primary Examiner—Vuthe Siek
Assistant Examiner—Magid Y Dimyan
(74) *Attorney, Agent, or Firm*—Birch, Stewart, Kolasch & Birch, LLP

(57) ABSTRACT

A high-level synthesis method is provided for synthesizing a register transfer level logic circuit based on a behavioral description in which processing behaviors are described. The method includes the steps of extracting information on a bus connection resource from the behavioral description, storing the information on the bus connection resource in a bus connection resource database, referencing the bus connection resource database, referencing a bus protocol library having a preloaded bus protocol, and automatically generating a target interface circuit based on a result of each of the bus connection resource database referencing step and the bus protocol library referencing step.

14 Claims, 17 Drawing Sheets

FIG.2

```
1     #pragma  stdbus   x
2     #pragma  busaddr  x  0x4000
3     void  circuit (chan  int  in , achan  int  x , chan  int  out)
4     {
5             send (out, receive (in) * x );
6     }
7
8     void  tbench (chan  int  in , achan  int  x , chan  int  out)
9     {
10            x=2;
11            send (in , 1);
12            receive (out);
13    }
14
15    void  main ( )
16    {
17            chan  int  in , out ;
18            achan  int  x :
19            par
20            {
21                    circuit (in , x, out );
22                    tbench (in , x , out);
23            }
24    }
```

FIG.20

```
1    void circuit (chan unsigned#1 arm_ready,
2                  chan unsigned#1 bach_done,
3                  achan signed#8 data)
4    {
5    #pragma amba_asb arm_ready,bach_done,data;
6    ....
7    while(1) {
8            ....
9            receive(arm_ready);
10                    //wait until receiver is ready.
11           send (data,....);
12           send (bach_done, 1);
13           }
14   }
15
16   void testbench (chan unsigned#1 arm_ready,
17                   chan unsigned#1 bach_done,
18                   achan signed#8 data)
19   {
20   ....
21   }
22
23   void main ()
24   {
25           chan unsigned#1 arm_ready, bach_done;
26           achan signed#8 data;
27
28           par {
29                   circuit (arm_ready,bach_done,data);
30                   testbench(arm_ready,bach_done,data);
31           }
32   }
33   #pragma amba_addr arm_ready  0x80000000
34   #pragma amba_addr bach_done  0x80000004
35   #pragma amba_addr data       0x80000008
```

FIG.21

| Bus transfer communication path | Address |
|---|---|
| arm_ready | 0x80000000 |
| bach_done | 0x80000004 |
| data | 0x80000008 |

FIG.22

```
1     #define ADDR_ARM_READY  (unsigned *) 0x80000000
2     #define ADDR_BACH_DONE  (unsigned *) 0x80000004
3     #define ADDR_DATA       (unsigned *) 0x80000008
4     ....
5     sync_send (*ADDR_ARM_READY);           //init. handshake
6     ....
7     sync_receive (*ADDR_BACH_DONE);        //wait sender done
8     t = receive(ADDR_DATA);
9     ....
10    sync_send (*ADDR_ARM_READY);           //for next transfer
11    .....
```

FIG.23

```
1     //send for synchronous ARM and Bach ckt
2     #define sync_send(a)      (a) = 1
3
4     //waiting for synchoronous signal from Bach ckt.
5     #define sync_receive(a)   (while((a) == 0))
6
7     //send to achan or memory
8     #define send(a,d)    (a) = (d)
9
10    //read from achan or memory
11    #define receive(a)   (a)
```

HIGH-LEVEL SYNTHESIS METHOD, HIGH-LEVEL SYNTHESIS APPARATUS, METHOD FOR PRODUCING LOGIC CIRCUIT USING THE HIGH-LEVEL SYNTHESIS METHOD FOR LOGIC CIRCUIT DESIGN, AND RECORDING MEDIUM

BACKGROUND OF THE INVENTION

1. Field of the Invention

The present invention relates to a high-level synthesis method and apparatus for automatically generating a logic circuit for a semiconductor integrated circuit (LSI) represented by a behavioral description in which processing behaviors are described, and also relates to a method for producing a logic circuit using the high-level synthesis method for logic circuit design, and a recording medium. More particularly, the present invention relates to a high-level synthesis method and apparatus for automatically generating an interface circuit used to interface with a bus having a predetermined protocol so as to perform data transfer with an external circuit, such as a general-purpose CPU, based on a behavioral description described in a language having a high level of abstractness, such as the C language, with the method and apparatus being used to synthesize a hard-wired circuit, and also relates to a method for producing a logic circuit using the high-level synthesis method for logic circuit design, and a recording medium.

2. Description of the Related Art

Recent micro processing technologies have allowed larger system LSIs. A development environment in which such system LSIs can be efficiently designed and tested is much sought after.

In the 1990s, a logic synthesis tool has been developed into practical use. Following this, a behavioral synthesis tool for synthesizing a description having a register transfer level (hereinafter referred to as an RT level) based on a behavioral description in which behaviors are described excluding information on hardware structure has been at a practical stage. The behavioral synthesis tool can generate LSI designs, comparable to those manually produced, in a shorter period of time.

When such a behavioral synthesis tool is used, a designer can concentrate his or her effort on designing an algorithm, which determines an essential behavior of an LSI, that largely relies on manual work.

At an early stage of the designing of a large digital LSI, such as a system LSI, an algorithm of an entire system is first studied and tested (this process is referred to as an "algorithm design"). Here, a software description language, such as a programming language (e.g., the "C language"), is used to design and test an algorithm on a workstation or a personal computer. Subsequently, individual processes required in a system are described with a hardware description language into behavioral descriptions which will be tested. That is, an algorithm previously described with a software description language is described again with a hardware description language into a behavioral description. Hence, conventionally, a method (high-level synthesis method) for synthesizing a circuit based on an algorithm of an entire system or behavioral descriptions using the C language has been proposed. Such a conventional technique is, for example, disclosed in Japanese Laid-Open Publication No. 10-116302, entitled "Method for Designing Integrated Circuit and Integrated Circuit Designed by the Method".

At present, a language having a high level of abstractness, such as the "C language", is used to describe a behavior of hardware which realizes an application, such as audio or video processing, and to synthesize a hardware circuit (high-level synthesis).

In the case of the development of a large system, a part of the processing may be implemented by software which is executed by a processor, thereby facilitating the modification of specifications or the extension of functions. In this case, a system is constructed by combining a plurality of functional blocks, such as an ASIC (Application Specific Integrated Circuit), a CPU (Central Processing Unit) for executing software, and a memory. In such a system, data transfer between each functional block is performed on a bus having a predetermined transfer protocol. Therefore, a bus interface circuit needs to be attached to each functional block in order to interface between the functional block and a bus.

The bus interface circuit is operated in accordance with the protocol. The bus interface circuit interprets a control signal or an address, and transfers data on a bus to a resource (memory element) in each functional block or drives desired data from each functional block and places the data on a bus. Since these behaviors are primitive compared to an application executed by each functional block, it is not efficient to describe the behaviors into behavioral descriptions and synthesize circuits corresponding to the behaviors. Further, behavioral synthesis is not recommended for interface circuits which have fixed timing. This is because the timing of the data transfer is fixed due to scheduling of behavioral synthesis in which a logic circuit is generated based on a behavioral description which lacks information on circuit structure.

Further, if a constraint relating to the timing of data transfer is added, an interface circuit can be synthesized which is compatible with its timing specification. In this case, however, a behavioral description for generating the interface circuit may be complicated, other synthesized circuit portions may have poor performance, the synthesized interface circuit may occupy a large area in an actual LSI, or the like, which are disadvantages.

To avoid this, conventionally, an interface circuit is separately designed, mainly, by manual work and attached to an application section. FIG. 24 is a design flowchart showing such a conventional technique. As shown in FIG. 24, in a conventional design technique, circuit portions other than an interface circuit are synthesized in accordance with a process flow from an "behavioral description" via predetermined processes to "RT level circuit description". However, only the interface circuit is separately designed by manual work. The "RT level circuit description" and the design of the interface circuit are combined into an "entire circuit description".

As shown in FIG. 24, the aforementioned predetermined processes include: an "behavioral description analyzing section" for parsing a behavioral description in which processing behaviors are described; a "control data flow graph (hereinafter referred to as CDFG) generation section" for representing a dependence relationship between operations in the behavioral description in terms of execution order; a "scheduling section" for successively allocating time to each operation, input, and output step in CDFG; an "allocation section" for allocating an operator, a register and input and output pins required to execute a scheduled CDFG to nodes; a "data path generating section" for generating a circuit path (e.g., a multiplexer) corresponding to a data-dependent branch in a CDFG; a "controller generating section" for generating a controller which controls an operator, a register, and a multiplexer generated by allocation and data path generation. These predetermined processes are described in detail later.

In the above-described conventional technique, the interface circuit is designed by manual work. In this case, if an application is complicated and data transfer via a bus is required between a number of resources (memory elements), such as communication paths, memories, and registers, the design of interface circuits is significantly complicated for manual work and errors are likely to occur.

Further, since interface circuits are designed separately from an application, every time the application is changed and the number of resources or the type of data is changed, interface circuits need to be modified by manual work.

In most design developments of circuits, the specifications of the circuits are often changed. If inputs and outputs of a circuit are changed, the interface circuits have to be modified. Modification of circuits is a time-consuming task, resulting in extension of an increased design time.

Errors are likely to occur in manual design. Further, data transfer to and from a memory via a bus is typically performed. In conventional manual design, memory addresses for data transfer need to be managed, which is significantly complicated for manual work and errors are likely to occur.

As described above, if a system is large, a part of processing is sometimes implemented by software executed by a CPU. In this case, a large system requires a CPU for executing software, and consists of hardware and software. Hardware needs to be developed apart from software. In order to perform data transfer between hardware and software, addresses etc. of resources in a CPU need to be designated. Address information needs to be managed, in which errors are likely to occur if managed manually.

SUMMARY OF THE INVENTION

A high-level synthesis method according to the present invention is provided for synthesizing a register transfer level logic circuit based on a behavioral description in which processing behaviors are described. The method includes the steps of extracting information on a bus connection resource from the behavioral description, storing the information on the bus connection resource in a a bus connection resource database, referencing the bus connection resource database, referencing a bus protocol library having a preloaded bus protocol, and automatically generating a target interface circuit based on a result of each of the bus connection resource database referencing step and the bus protocol library referencing step. Thereby, the above-described object of the present invention is achieved. A high-level synthesis apparatus according to the present invention is provided for synthesizing a register transfer level logic circuit based on a behavioral description in which processing behaviors are described. The apparatus includes a bus connection resource extracting section for extracting information on a bus connection resource from the behavioral description, a bus connection resource database for storing the information on the bus connection resource relating to a communication path, a memory, and a register to be connected to a bus, a bus protocol library for storing a bus protocol in advance, and a bus interface generating section for automatically generating a target interface circuit by referencing the bus connection resource database and the bus protocol library.

Accordingly, a bus connection resource database and a bus protocol library are referenced. Therefore, a bus interface circuit, which is conventionally designed by manual work, can be automatically synthesized. An RT level circuit of an entire circuit including the bus interface circuit can be synthesized based on a behavioral description. Therefore, it is easy to manage resources within a circuit, and errors which are inevitable in manual design are eliminated, whereby design quality is improved and a period of time for design is shortened.

Preferably, the high-level synthesis method of the present invention further includes referencing the bus connection resource database to automatically generate a preloaded software header file for a target bus. Further, preferably, the high-level synthesis apparatus of the present invention further includes a preloaded software header file generating section for automatically generating a preloaded software header file relating to a target bus by referencing the extracted information on the bus connection resource and the bus connection resource database.

Accordingly, if a CPU is present in a system, a header file is automatically generated by referencing information on resources. The information on resources which are conventionally managed by manual work can be automatically managed, whereby design quality is improved and a period of time for design is shortened.

Preferably, the high-level synthesis method of the present invention further includes referencing the bus connection resource database to automatically generate a preloaded software library function for a target bus. Further, preferably, the high-level synthesis apparatus of the present invention further includes a preloaded software library function generating section for automatically generating a preloaded software library function relating to a target bus by referencing the extracted information on the bus connection resource and the bus connection resource database.

Accordingly, if a CPU is present in a system, a library function is automatically generated by referencing information on resources. The information on resources which are conventionally managed by manual work can be automatically managed, whereby design quality is improved and a period of time for design is shortened.

Preferably, the information on the bus connection resource includes information on a communication path, a memory and a register to be connected to a bus.

Further, a method is provided for producing a logic circuit using the high-level synthesis method of the present invention.

Furthermore, a computer readable recording medium is provided for storing a computer program for executing the high-level synthesis method of the present invention.

Thus, the invention described herein makes possible the advantages of providing a high-level synthesis method and apparatus for automatically generating a bus interface circuit, which performs data transfer to and from an external circuit, from a behavioral description, and a high-level synthesis apparatus using the method, and a method for producing a logic circuit using the high-level synthesis method, and a recording medium.

These and other advantages of the present invention will become apparent to those skilled in the art upon reading and understanding the following detailed description with reference to the accompanying figures.

BRIEF DESCRIPTION OF THE DRAWINGS

FIG. 2 is a diagram showing an example of a behavioral description stored in a behavioral description storing section shown in FIG. 1.

FIG. 20 is a diagram showing an exemplary behavioral description for a circuit including an ARM as a general-purpose CPU.

FIG. 21 is a diagram showing a correspondence between addresses and bus transfer communication paths.

FIG. 22 is a diagram showing a programming where an ARM is used as a general-purpose CPU.

FIG. 23 is diagram showing a library function where a bus AMBA is used.

DESCRIPTION OF THE PREFERRED EMBODIMENTS

Hereinafter, the present invention will be described by way of illustrative examples with reference to the accompanying drawings.

Figure 1:
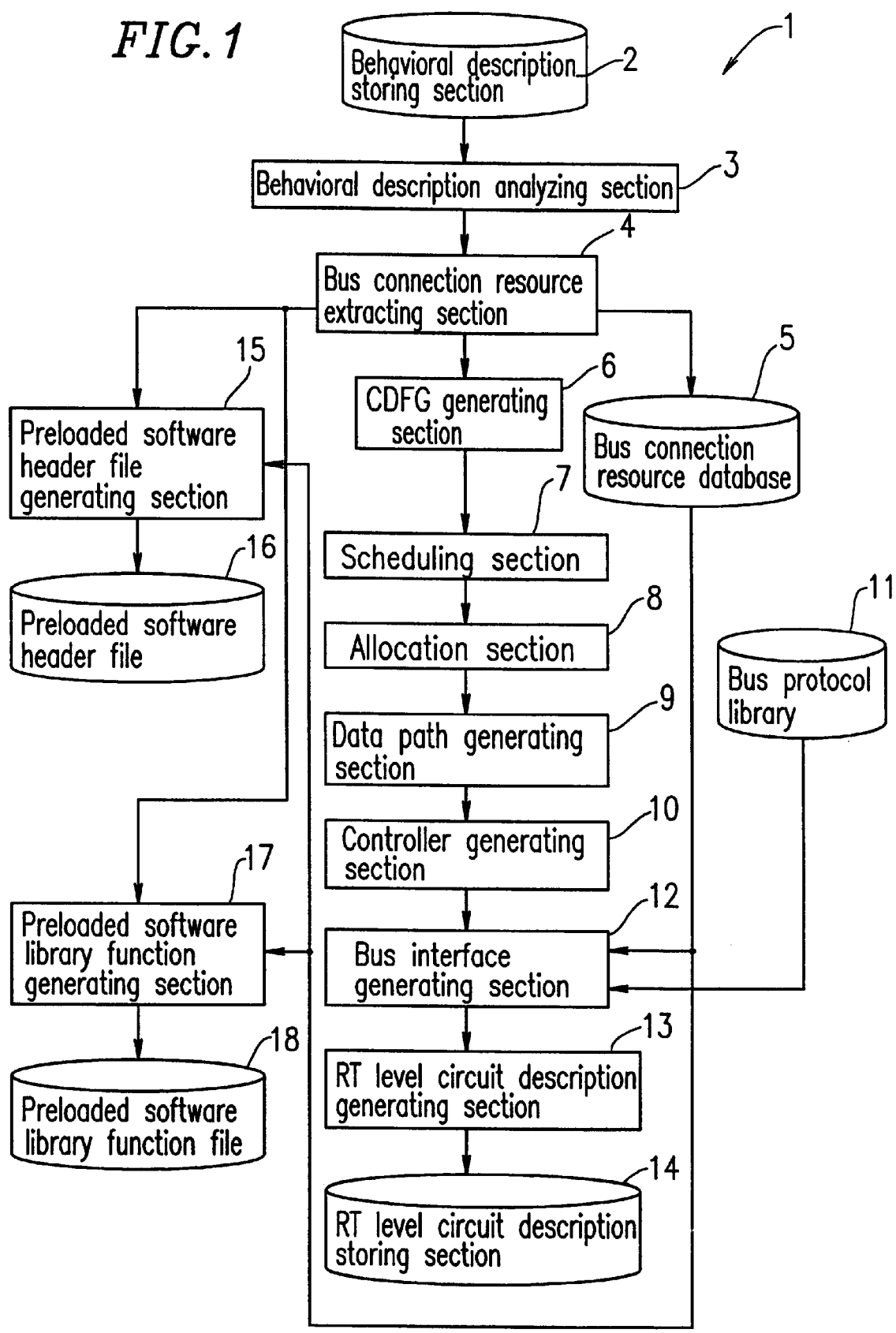
FIG. 1 is a block diagram showing a configuration of a high-level synthesis apparatus according to an embodiment of the present invention.

FIG. 1 is a block diagram showing a configuration of a high-level synthesis apparatus according to an embodiment of the present invention. In FIG. 1, a high-level synthesis apparatus 1 includes a behavioral description storing section 2, a behavioral description analyzing section 3, a bus connection resource extracting section 4, a bus connection resource database 5, a CDFG generating section 6, a scheduling section 7, an allocation section 8, a data path generating section 9, a controller generating section 10, a bus protocol library 11, a bus interface generating section 12, an RT level circuit description generating section 13, and an RT level circuit description storing section 14. A bus interface circuit automatically generated by the bus interface generating section 12 is attached to an operator, a register, a data path, a controller circuit, and the like, which are generated based on a behavioral description. As a result, an entire RT level circuit is synthesized.

The behavioral description storing section 2 is used to store a behavioral description in which processing behaviors are described. For explanation purposes only, a behavioral description is written in "Bach-C". "Bach-C" is a member of a language family for supporting LSI design based on a description of a system algorithm. Bach-C is created based on the C language, and has additional features: data bit-width specification; a syntax for explicit parallelism; and data communication instructions for parallelism. The further details of Bach-C are described in "Bach: Environment for LSI Design with C Language", The 11$^{th}$ Workshop on Circuits and Systems in Karuizawa, Apr. 20–21, 1998, and "Hardware Complier Bach", TECHNICAL REPORT OF IEICE CPSY97–87 (1997-10).

An example of a behavioral description in Bach-C is shown in FIG. 2.

FIG. 2 is a diagram showing an example of a behavioral description stored in the behavioral description storing section 2 shown in FIG. 1. This behavioral description is described in Bach-C. In FIG. 2, a behavioral description includes data transfer to a bus. In the behavioral description shown in FIG. 2, a first line declares that a resource x is connected to a bus stdbus, and a second line defines that the address of the bus stdbus is 0x4000. A function circuit( ) described at lines 3–6 represents a behavior of a circuit which will be subjected to behavioral synthesis. In the circuit behavior, data is received through a synchronous communication path in, the data is multiplied by a value indicated by the asynchronous communication path x, and the resultant product is output to a synchronous communication path out. A function tbench( ) described at lines 8–13 represents a behavior of an external environment of the circuit. In the behavior, the asynchronous communication path x is set to have a value "2", a synchronous communication path in is set to have a value of "1", and a calculation result is received through a synchronous communication path out. A function main( ) described at lines 15–24 represents an entire behavior of the circuit and the external environment.

Here, a resource to be connected to a bus is described in the above-described behavioral description as follows.

Pragma stdbus res_name
Pragma busaddr res_name addr where res_name represents a resource identifier, stdbus includes information representing a bus type (protocol type), busaddr refers to designation of an address addr of the resource identifier res_name in a bus address space.

The behavioral description further including the above-described resource information on a bus is extracted by a bus connection resource extracting section 4 described later, thereby obtaining information on a resource connected to the bus.

As described above, a user can designate a resource by describing the resource to be connected to a bus in a behavioral description. Alternatively, a resource may be optionally designated when a command is issued. Any method may be used which can designate an identifier of a resource to be connected to a bus, a protocol type of the bus connecting to the resource, and an address assigned to the resource. When an identifier of a resource is found, a behavioral description is then analyzed, and a bit width of data declared with respect to the resource can be obtained.

The behavioral description analyzing section 3 analyzes the syntax of the above-described behavioral description which describes processing behavior.

The bus connection resource extracting section 4 extracts, from a behavioral description in which processing behaviors are described, information on a path and/or memory for data communication with the outside which is represented by the behavioral description. Specifically, from the behavioral description shown in FIG. 2, the following information is extracted: the bus type is stdbus; the resource to be connected to the bus is an asynchronous communication path x; and the address of the asynchronous communication path x is 0x4000.

The bus connection resource database 5 saves the communication path and/or the memory extracted by the bus connection resource section 4, and resource information identifying the communication path and/or the memory, such as address and data width. Specifically, this resource information is the identifier of a resource to be connected to a bus (communication path memory), a protocol type of the bus connecting to the resource, an address assigned to the resource, a data width of the resource, and the like.

Figure 3:
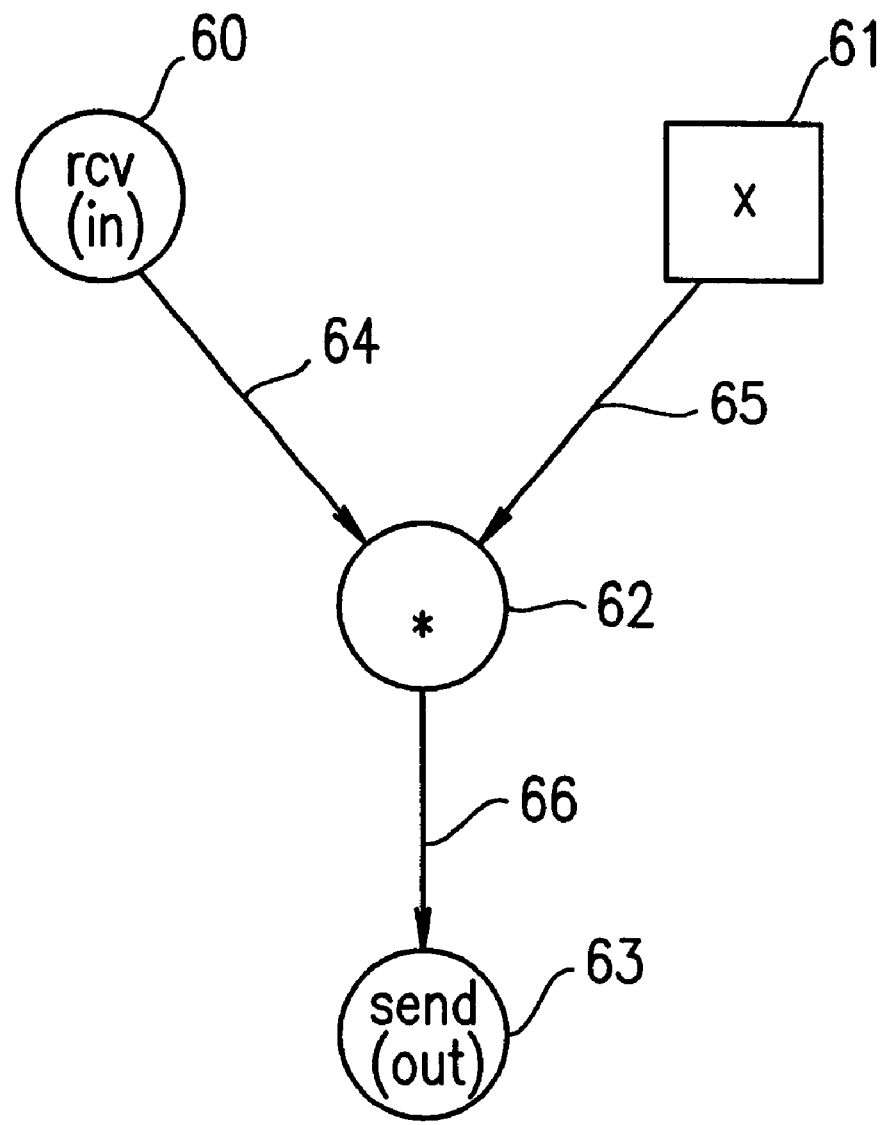
FIG. 3 is a diagram showing a control data flow graph generated by a CDFG generating section shown in FIG. 1.

The CDFG generating section 6 generates CDFG representing a dependence relationship between operations in a behavioral description in terms of execution order. This CDFG is a graph where an input, an output, an operation, a constant, a communication (transmission and reception), a branch, and a loop each are represented as a node, and a dependence relationship is represented as a directed branch (data-dependent branch). For example, the behavioral description shown in FIG. 2 is converted to a CDFG as shown in FIG. 3 which includes nodes, i.e., rcv(in) 60 representing a data input through a synchronous communication path in, a data input 61 through an asynchronous communication path x, an operation 62, and send(out) 63 representing an output of an operation result to a synchronous communication path out, and data-dependent branches 64 through 66 which connect between the nodes.

Figure 4:
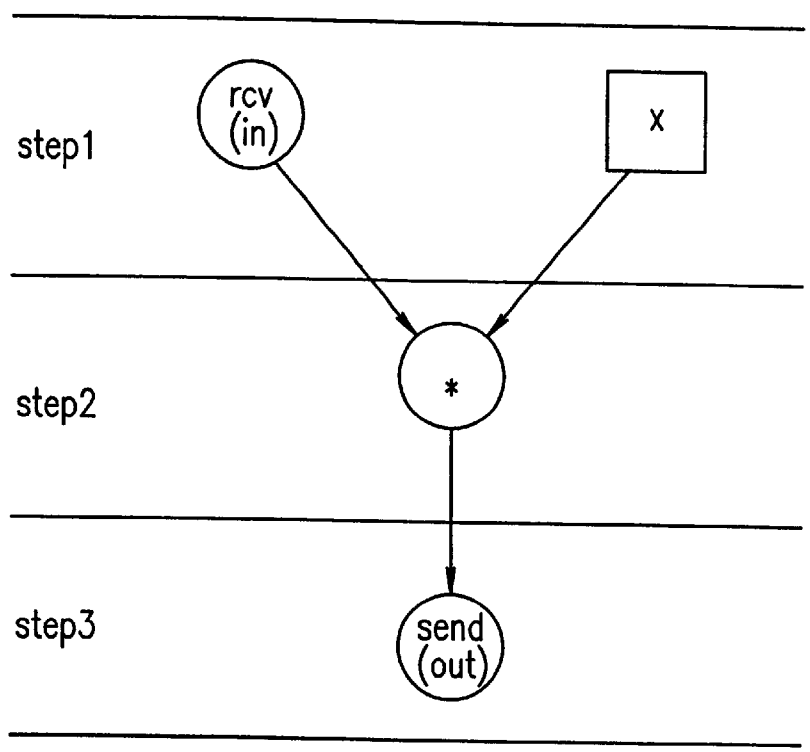
FIG. 4 is a diagram showing a result of scheduling by a scheduling section shown in FIG. 1.

The scheduling section 7 successively allocates a clock time (called a step) to each operation, input, and output of a CDFG. For example, FIG. 4 is a diagram showing a result of scheduling the CDFG shown in FIG. 3 to three steps.

Figure 5:
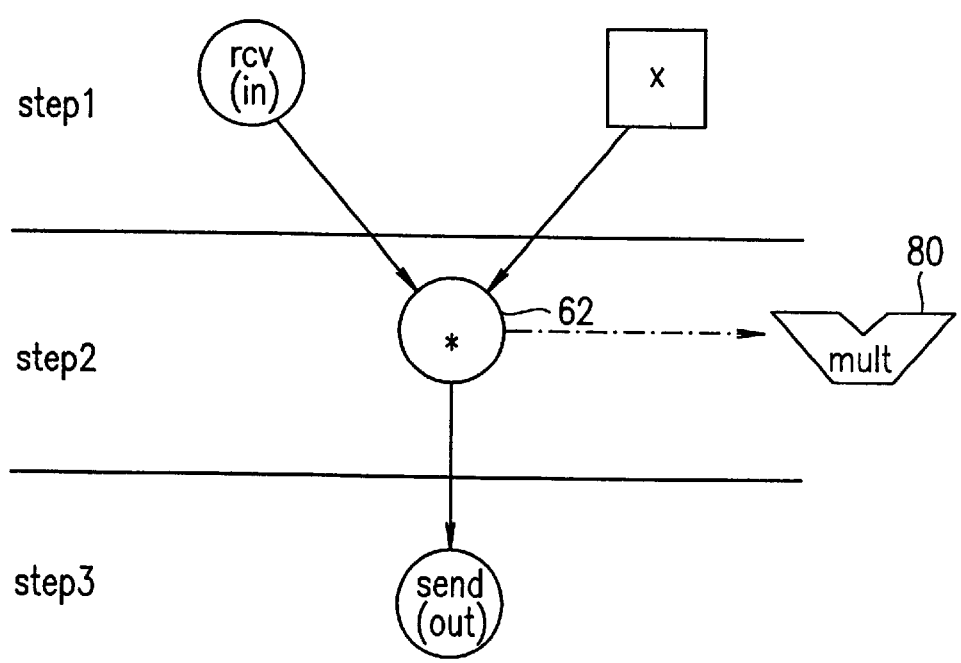
FIG. 5 is a diagram showing a result of an allocation section shown in FIG. 1 where a multiplier is allocated to an operation.
Figure 6:
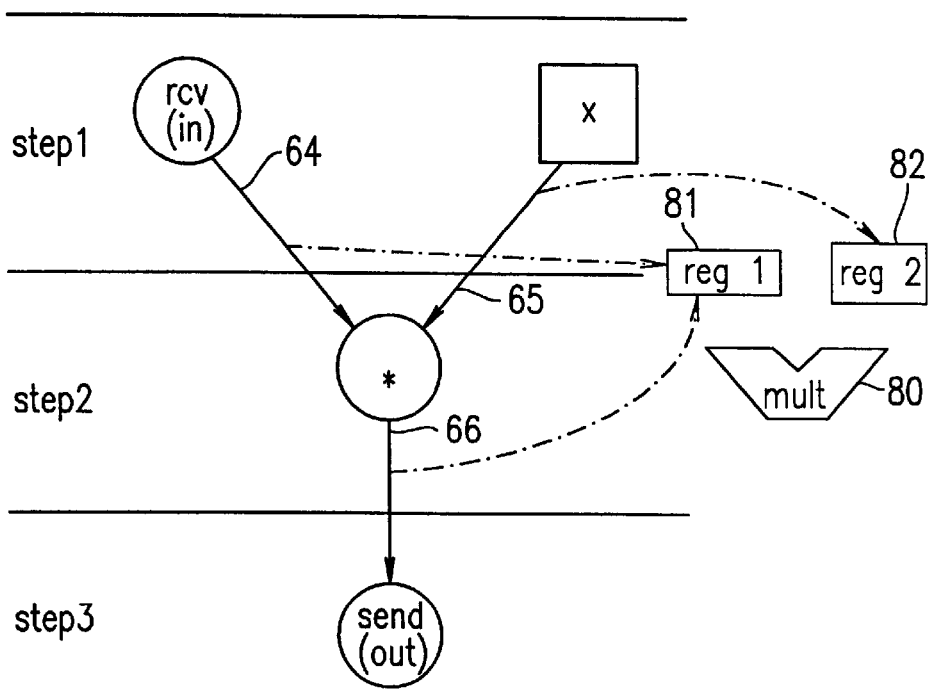
FIG. 6 is a diagram showing a result of the allocation section shown in FIG. 1 where a data-dependent branch is allocated to a register.
Figure 7:
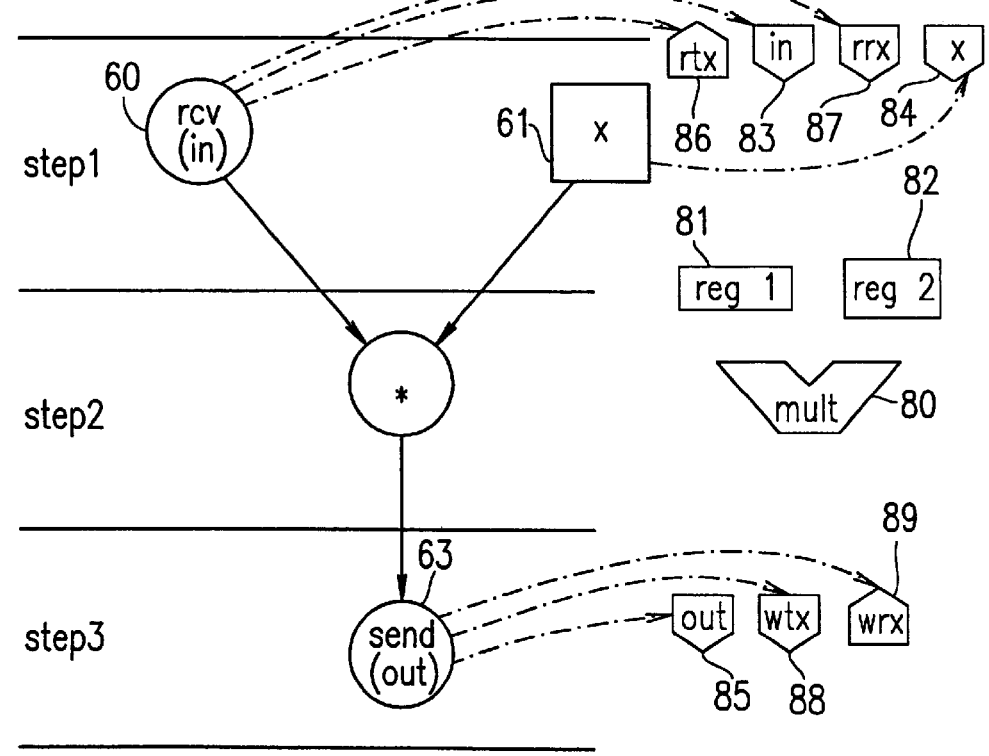
FIG. 7 is a diagram showing a result of the allocation section shown in FIG. 1 where input and output pins are allocated to an input and an output.

The allocation section 8 generates an operation, a register, an input pin and an output pin required for execution of the scheduled CDFG, and allocates an operation in the CDFG to the operator, a data-dependent branch across a clock boundary to a register, an input to an input pin, and an output to an output pin. For example, as shown in FIG. 5, the operation 62 is allocated to a multiplier 80 in accordance with the content of the operation 62. As shown in FIG. 6, the data-dependent branches 64 through 66 across respective clock boundaries are allocated to registers 81 and 82. In this case, the data-dependent branch 64 and 66 cross different clock boundaries, i.e., have different operating times and therefore, are allocated to the same register 81. As shown in FIG. 7, the inputs 60 and 61, and the output 63 are allocated to input pins 83 and 84 and an output pin 85, respectively. Further, the input 60 is allocated to control signal input pins 86 and 87 in addition to the data pin, and the output 63 is allocated to control signal output pins 88 and 89.

Figure 8:
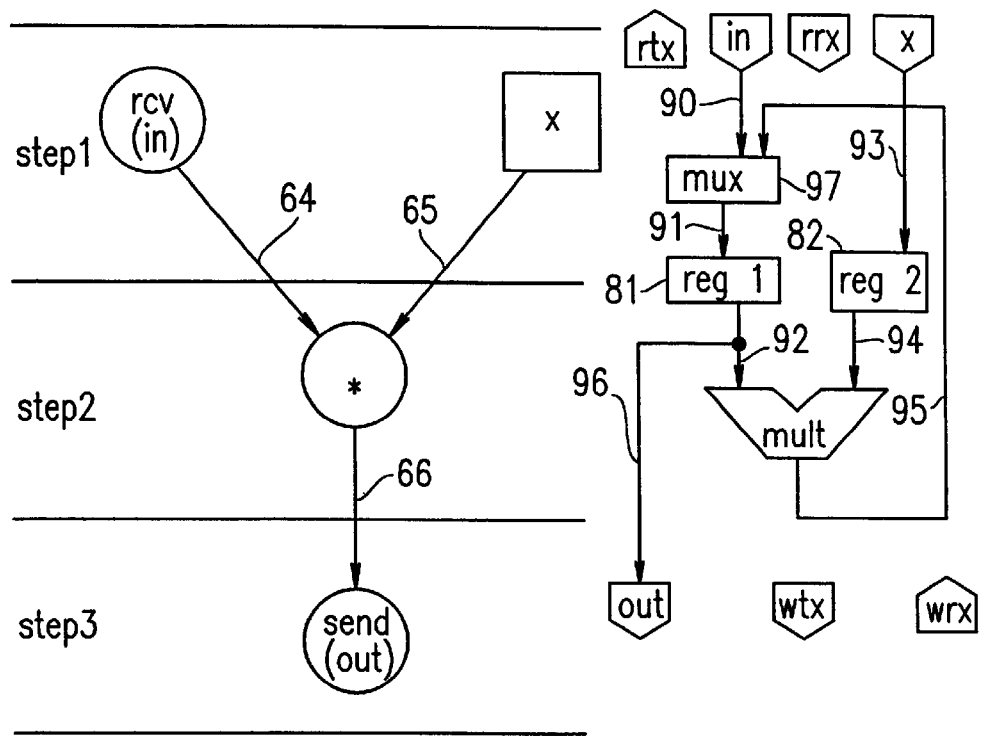
FIG. 8 is a diagram showing a result of a data path generating section shown in FIG. 1 where a data-dependent branch is allocated to a data path.

The data path generating section 9 generates a data paths (multiplexer) corresponding to the data-dependent branches 64 through 66 in the CDFG. FIG. 8 is a diagram showing an example of a result of data path generation. In FIG. 8, data paths 90 through 92 corresponding to the data-dependent branch 64, data paths 93 and 94 corresponding to the data-dependent branch 65, data paths 95, 91, 92, and 96 corresponding to the data-dependent branch 66, are generated. In this case, since the register 81 is shared by the data-dependent paths 64 and 66 in the allocation process shown in FIG. 6, a multiplexer 97 is added between the data paths 90 and 91 in FIG. 8.

Figure 9:
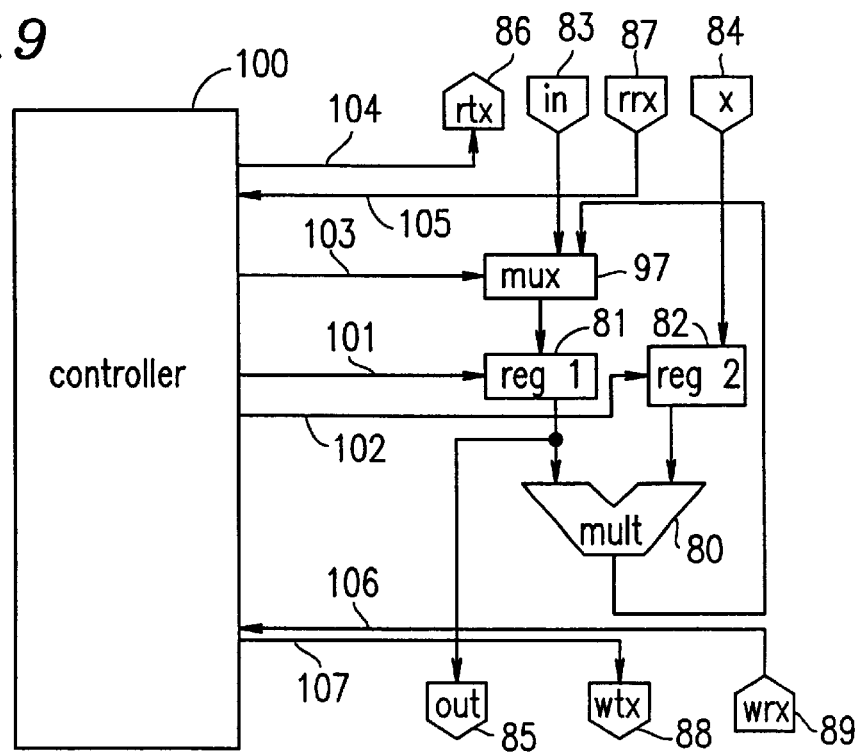
FIG. 9 is a diagram showing an RT level circuit of a control circuit generated by a controller generating section shown in FIG. 1.

The controller generating section 10 generates a controller for controlling the operator 80, the registers 81 and 82, and the multiplexer 97 which are generated in the above-described allocation process and data path generation process. FIG. 9 is a diagram showing an example of a result of the controller generation. In FIG. 9, control signal lines 101 and 102 from the controller 100 to the respective registers 81 and 82, a control signal line 103 to the multiplexer 97, control signal lines 104 and 105 to the respective input pins 86 and 87, control signal lines 106 and 107 to the respective output pins 89 and 88, are generated.

The bus protocol library 11 stores bus timing, and types of control signal lines as a library.

Figure 10:
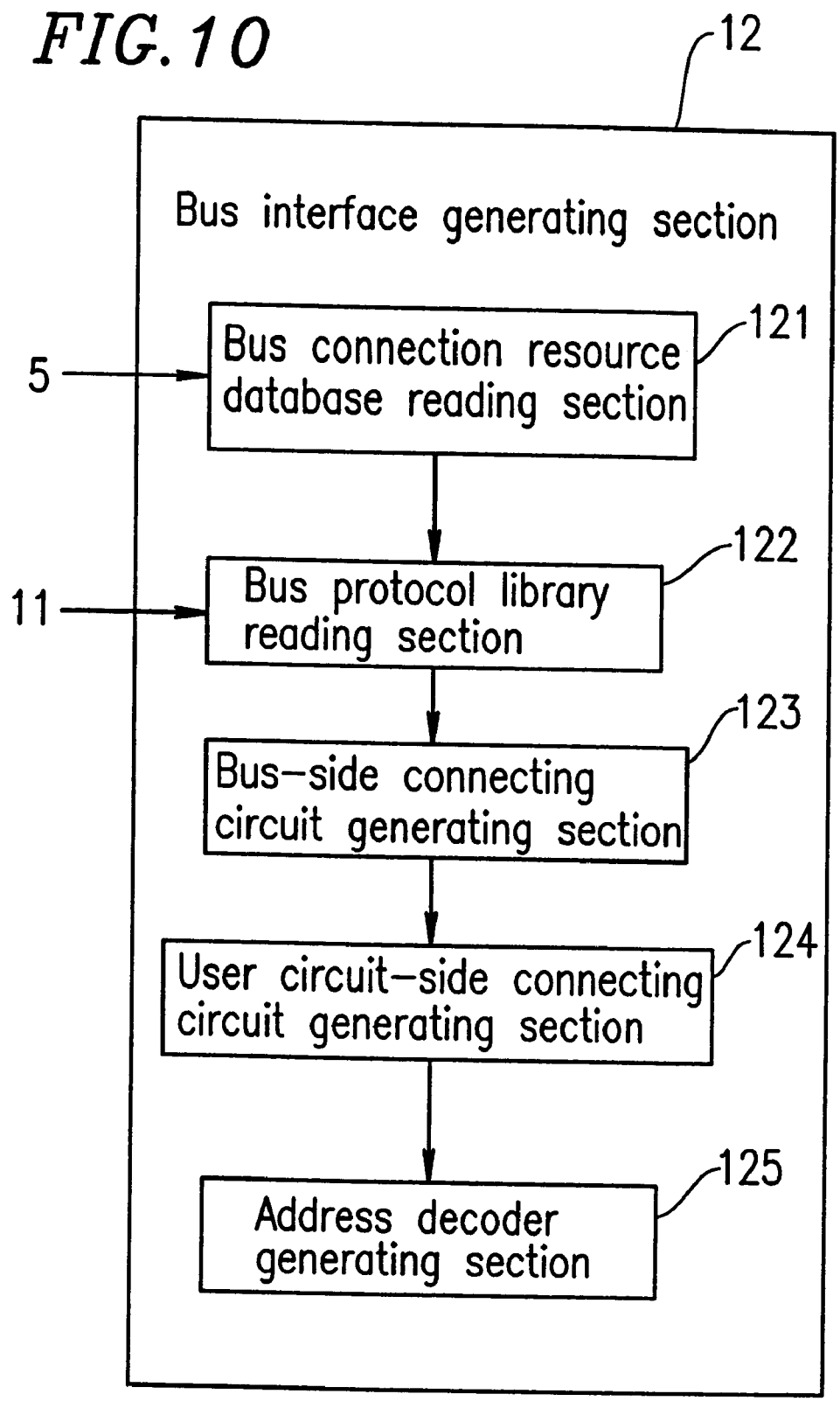
FIG. 10 is a block diagram showing a detailed configuration of a bus interface generating section shown in FIG. 1.

The bus interface generating section 12 generates a bus interface circuit with reference to the bus connection resource database 5 and the bus protocol library 11, and a detailed description thereof is shown in FIG. 10.

FIG. 10 is a block diagram showing a detailed configuration of the bus interface generating section 12 shown in FIG. 1. In FIG. 10, the bus interface generating section 12 includes a bus connection resource database reading section 121, a bus protocol library reading section 122, a bus-side connecting circuit generating section 123, a user circuit-side connecting circuit generating section 124, and an address decoder generating section 125.

The bus connection resource database reading section 121 reads the bus connection resource database 5 to obtain an identifier of a resource to be connected to a bus, a type of a bus to connect, a bit width of data, and an address.

The bus protocol library reading section 122 reads the bus protocol library 11 to obtain, for the protocol type of each bus, a type of a signal to be used on the bus, a direction (input or output) of each signal, a bit width of each signal, and the timing of input and output of each signal.

The bus-side connecting circuit generating section 123 generates a circuit for input and output of a signal between a bus and an interface circuit with reference to a signal type used on the bus.

The user circuit-side connecting circuit generating section 124 generates input and output circuits between a user-side circuit automatically generated by high-level synthesis, and an interface circuit. Here, the user circuit-side connecting circuit generating section 124 generates a circuit for transferring data on a bus to all resources connected to the bus in the writing of the data, and a circuit for outputting data in the resources onto a bus in the reading of the data.

The address decoder generating section 125 interprets an address received from the bus-side and a control signal in reading or writing to generate a circuit for outputting a read enable signal or a write enable signal for a resource corresponding to the address. As a result, a generated interface circuit has a circuit configuration at an RT level which will be described below.

Figure 11:
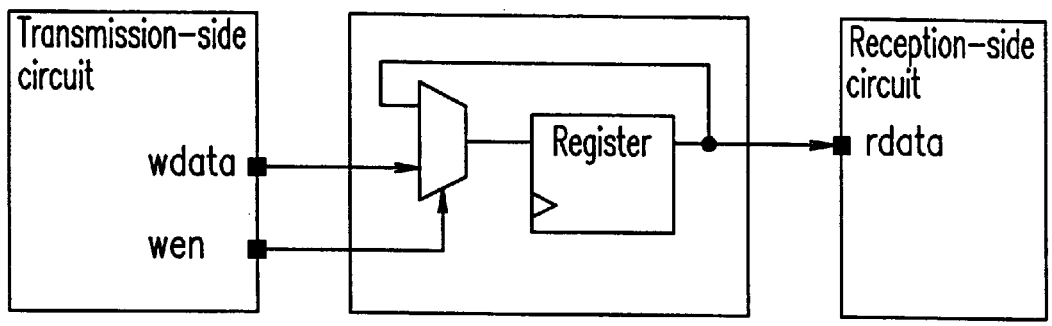
FIG. 11 is a circuit diagram showing an interface circuit for an asynchronous communication path using a register.

In data transfer using an asynchronous communication path, data reading and writing are performed with separate timings between transmission side and reception side. In this case, a synthesized circuit configuration is shown in FIG. 11. A transmission-side circuit outputs data to wdata and outputs a write enable signal to wen in a transmission step. The reception-side circuit reads data through rdata in a reception step.

Figure 12:
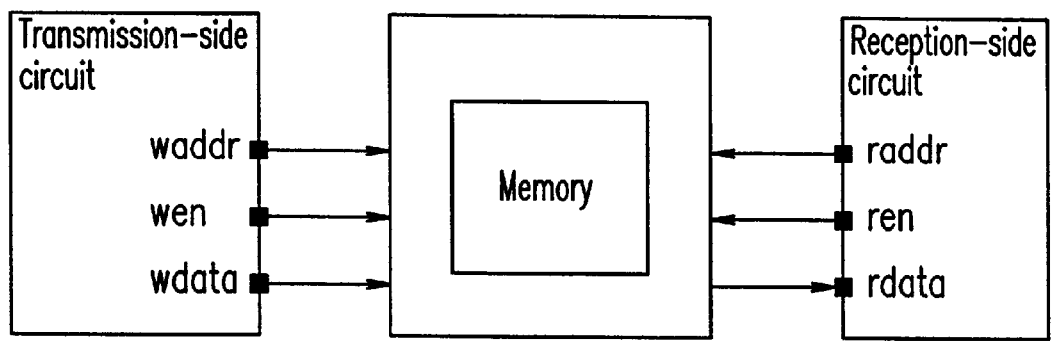
FIG. 12 is a circuit diagram showing an interface circuit using a memory.

In data transfer using a memory, data reading and writing are performed with arbitrary timings between a transmission-side circuit and a reception-side circuit. In this case, a synthesized circuit configuration is shown in FIG. 12. The transmission-side circuit outputs data, an address, and a write enable signal to wdata, waddr, and wen, respectively, in a transmission step. The reception-side circuit outputs a memory address and a read enable signal to raddr and ren, respectively, and reads data through rdata in a reception step.

Figure 13:
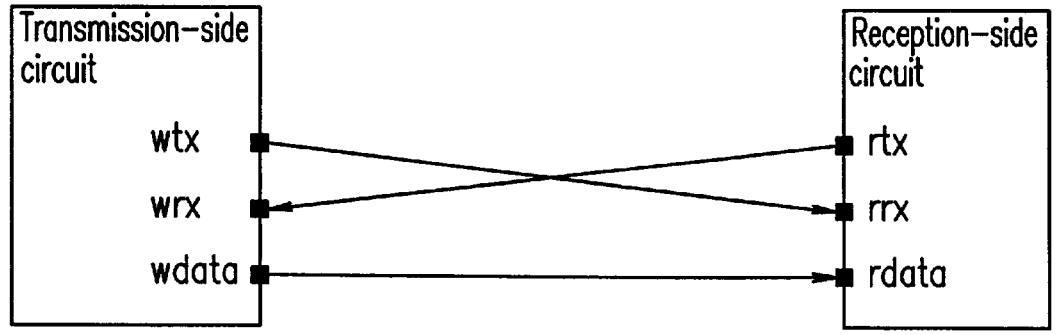
FIG. 13 is a circuit diagram showing an interface circuit in a synchronous communication path.

In data transfer using a synchronous communication path, a handshake needs to be established a transmission-side circuit and a reception-side circuit before starting data transfer. In this case, a synthesized circuit configuration is shown in FIG. 13. The transmission-side circuit causes wtx (its initial state is LOW level (i.e., low voltage)) to be transitioned to HIGH level, outputs data to wdata, and waits until wrx is transitioned to the HIGH level (i.e., high voltage). When wrx becomes HIGH level, wtx is transitioned to LOW level in a subsequent step. The reception-side circuit causes rtx (an initial state is LOW level) to be transitioned to HIGH level and waits until rtx is HIGH level in a reception step. When rtx becomes HIGH level, the reception-side circuit reads data through rdata, and rtx is transitioned to LOW level in a subsequent step. Further, in the case of bi-directional data transfer, a signal is shared by a transmission-side circuit and a reception-side circuit.

As described above, the bus interface generating section 12 shown in FIG. 1 generates a circuit for inputting and outputting signals with predetermined timing in accordance with a transmission protocol used by a bus with reference to a communication path and a memory saved in the bus connection resource database 5, and the bus protocol library 11 from which a control signal indicating a transmission mode, an address designating a resister or a memory for data transfer, data to be transfer, and a response indicating completion of transfer.

Various interface circuits may be generated by the bus interface generating section 12 shown in FIG. 1. For example, a memory circuit as shown in FIG. 12 may be, specifically, a circuit using FIFO, a circuit using a stack, or the like, other than a typical memory. Therefore, if the behavior specification of a transmission section and a reception section on a communication path is available, the bus interface generating section 12 shown in FIG. 1 generates an interface circuit, in accordance with the specification, based on processes of the above-described sections 121 through 125. Therefore, the bus interface generating section 12 shown in FIG. 1 can support a method for implementing a circuit other than the interface circuits shown in FIG. 11 through 13.

The RT level circuit description generating section 13 shown in FIG. 1 synthesizes an entire circuit at an RT level including a synthesized bus interface circuit, and outputs an RT level circuit description.

The RT level circuit description storing section 14 stores the RT level circuit description generated by the RT level circuit description generating section 13.

The high-level synthesis apparatus 1 includes a preloaded software header file generating section 15, a preloaded software header file 16, a preloaded software library function generating section 17, and a preloaded software library function file 18. When a general-purpose CPU is required in a system, the high-level synthesis apparatus 1 automatically generates a preloaded software header file using the preloaded software header file generating section 15. Alternatively, the high-level synthesis apparatus 1 may automatically generates a preloaded software library function using a preloaded software library function generating section 17.

The preloaded software header file generating section 15 automatically generates a preloaded software header file for a program executed by a general-purpose CPU with reference to the bus connection resource database 5. Note that according to a program executed by a general-purpose CPU, a user designates an address of each communication path to be connected to a bus in a memory space of the general-purpose CPU, whereby resource information is extracted by the bus connection resource extracting section 4 as described above and thereafter is stored in the bus connection resource database 5. A detailed configuration of the preloaded software header file generating section 15 is shown in FIG. 14.

Figure 14:
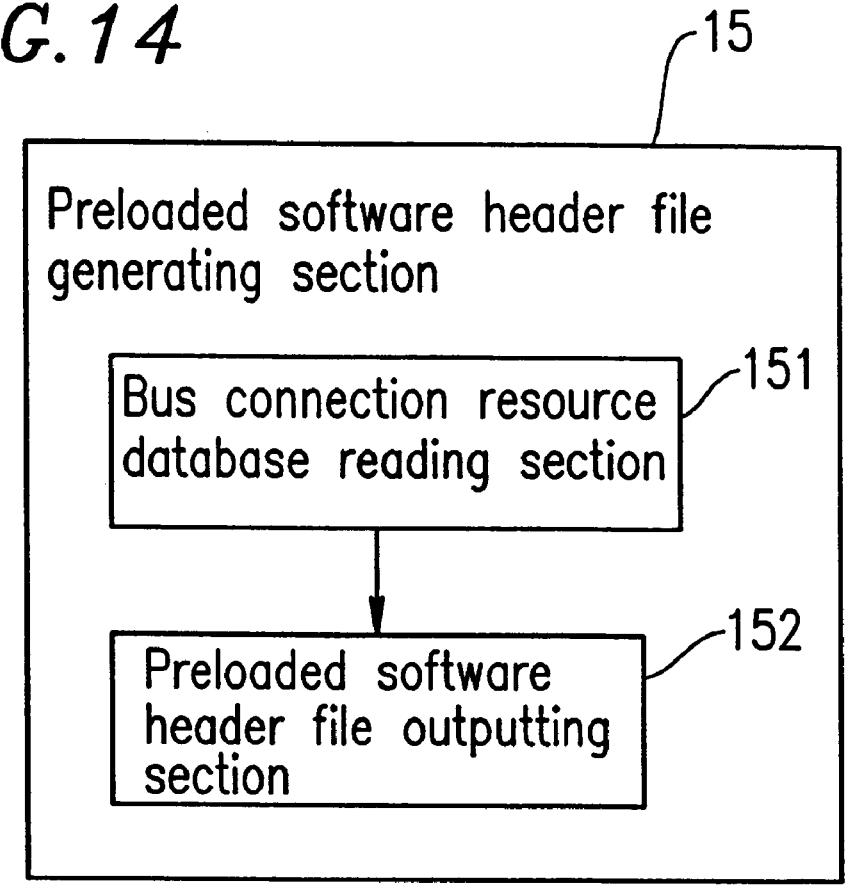
FIG. 14 is a block diagram showing a detailed configuration of a preloaded software header file generating section shown in FIG. 1.

FIG. 14 is a diagram showing a detailed configuration of the preloaded software header file generating section 15. In FIG. 14, the preloaded software header file generating section 15 includes a bus connection resource database reading section 151 and a preloaded software header file outputting section 152.

The bus connection resource database reading section 151 reads the bus connection resource database 5 shown in FIG. 1. The preloaded software header file outputting section 152 outputs addresses assigned to all resources to the preloaded software header file 16 shown in FIG. 1. The output format is represented by:

define ADDR_identifier address where the identifier represents a name of a resource and the address represents a value indicating an address.

The preloaded software header file 16 files the header file output from the preloaded software header file generating section 15.

The preloaded software library function generating section 17 generates a preloaded software library function for a program executed by a general-purpose CPU with reference to the bus connection resource database 5. Note that as described above, a resource name and a resource type are extracted by the bus resource extracting section 4 and thereafter are stored in the bus connection resource database 5 which is a bus communication path database.

The preloaded software library function includes the following functions which are required for communication via a bus.

Function Send( ): used to transmit (write) data via a bus from a CPU.

Function Receive( ): used to receive (read) data via a bus from a CPU.

Function Sync Send( ): used to transmit a handshake signal which informs a party on the other end of communication of a transmission ready state.

Function Sync Receive( ): used to receive a handshake signal which informs a party on the other end of communication of a reception ready state.

The preloaded software library function file 18 files library function outputs from the preloaded software library function generating section 17.

At present, LSI design is conducted using various software for design and test on a personal computer or a workstation. The high-level synthesis method of the present invention is installed in such hardware, or used as a part of design environment under network environment. A design apparatus in which the high-level synthesis method of the present invention can be used under such environment is a high-level synthesis apparatus according to the present invention.

A behavior of the above-described configuration will be described below.

Figure 15:
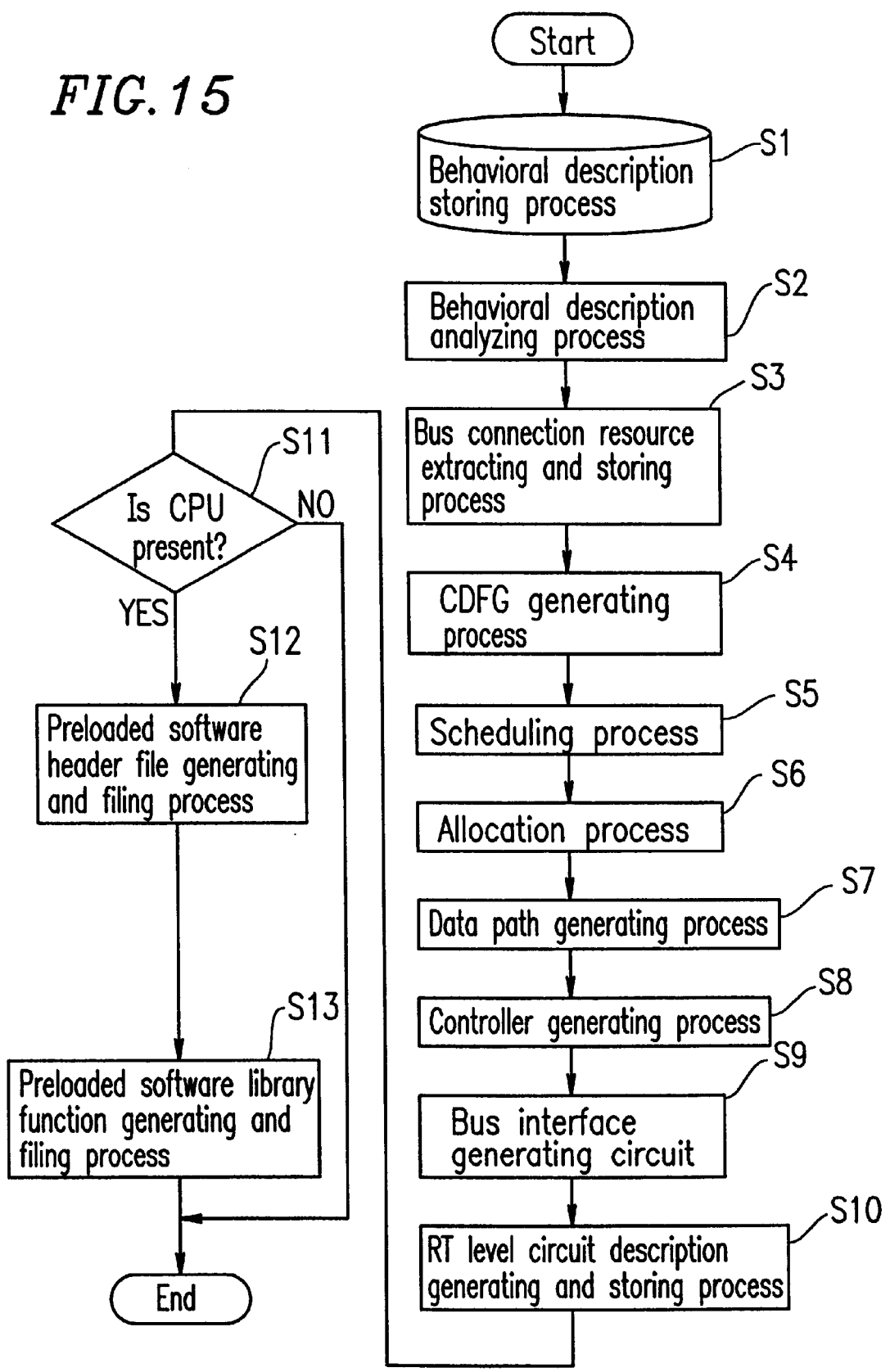
FIG. 15 is a process flowchart showing an operation of the high-level synthesis apparatus shown in FIG. 1.
Figure 24:
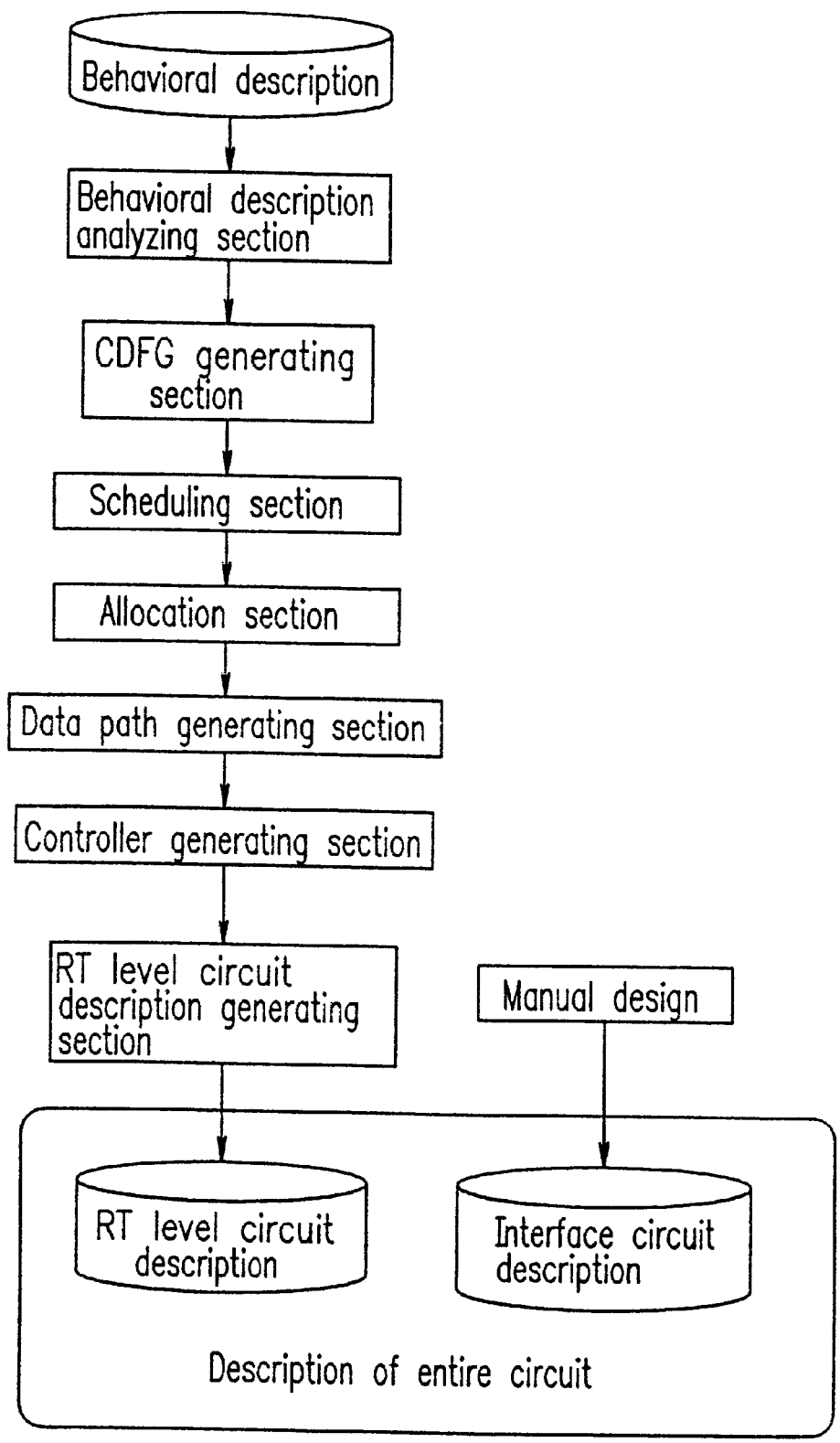
FIG. 24 is a process flowchart showing an operation of a conventional high-level synthesis apparatus.

FIG. 15 is a process flowchart showing a behavior of the high-level synthesis apparatus shown in FIG. 1. Note that the flowchart shown in FIG. 15 is almost the same as that shown in FIG. 24, except for the bus connection resource extracting and/or storing processes, the preloaded software header file generating and/or filing processes, the preloaded software library function generating and/or filing processes, which are features of the present invention, of the process flow from the behavioral description storing process to the RT level circuit description synthesizing process. Here, a behavior of the high-level synthesis apparatus will be described based on the behavioral description shown in FIG. 2, and the further details are described in Japanese Laid-Open Publication No. 12-020973, entitled "High-level Synthesis Method and Storage Medium Used to Execute the High-level Synthesis Method".

As shown in FIG. 15, in step S1, the behavioral description shown in FIG. 2 is input to the behavioral description storing section 2, and in step S2, the behavioral description analyzing section 3 parses the behavioral description.

Subsequently, in step S3, the bus connection resource extracting and storing processes are executed. Specifically, a communication path and a memory for data communication with the outside designated by the behavioral description shown in FIG. 2, e.g., a bus type stdbus, an asynchronous communication path x used as a resource to be connected to a bus, and an address 0x4000 thereof, are extracted. Resource information, such as the communication path, the address and the data width, are saved in the bus connection resource database 5. From step S4, a circuit represented by function circuit( ) in the behavioral description shown in FIG. 2 will be synthesized.

In step S4, the CDFG generating process is executed. For example, based on the behavioral description shown in FIG. 2, as shown in FIG. 3, a CDFG in which a data input rcv(in) 60 from a synchronous communication path in, a data input 61 from an asynchronous communication path x, and an operation 62, an output send(out) 63 which outputs an operation result to a synchronous communication path out are nodes, is generated.

In step S5, the scheduling process is executed. For example, as shown in FIG. 4, operations, inputs, and an output in the CDFG shown in FIG. 3 are scheduled into three steps.

In step S6, the allocation process is executed. In the allocation process, for example, the multiplier 80 is allocated to the operation 62 as shown in FIG. 5, the registers 81 and 82 are allocated to the data-dependent branch 64 through 66 as shown in FIG. 6, the input pins 83 and 84, and the output pin 85 are allocated to the inputs 60 and 61, and the output 63 as shown in FIG. 7, and the control signal input pins 86 and 87 and the control signal output pins 88 and 89 are allocated to other inputs and outputs.

In step S7, the data path generating process is executed. For example, as shown in FIG. 8, the data paths 90 through 92 corresponding to the data-dependent branch 64 are generated, the data paths 93 and 94 corresponding to the data-dependent branch 65 are generated, and the data paths 95, 91, 92, and 96 corresponding to the data-dependent branch 66 are generated. Further, since the register 81 is shared by the data-dependent branches, the multiplexer 97 is added.

In step S8, the controller generating process is executed. For example, as shown in FIG. 9, the controller 100 is generated, and the control signal lines 101 and 102 connected to the registers 81 and 82 of the controller 100, the control signal line 103 connected to the multiplexer 97, the control signal lines 104 and 105 connected to the input pins 86 and 87, and the control signal lines 106 and 107 connected to the output pins 89 and 88, are generated.

Thus, the RT-level circuit model including the data bus and the controller 100 required for processing is obtained, excluding an interface circuit portion which is a characteristic feature of the present invention.

In step S9, a bus interface generating process, which is a characteristic feature of the present invention, is executed. In the bus interface generating process, an interface circuit for performing data transfer to and from the outside is generated. The bus interface generating process will be described in detail below.

Figure 16:
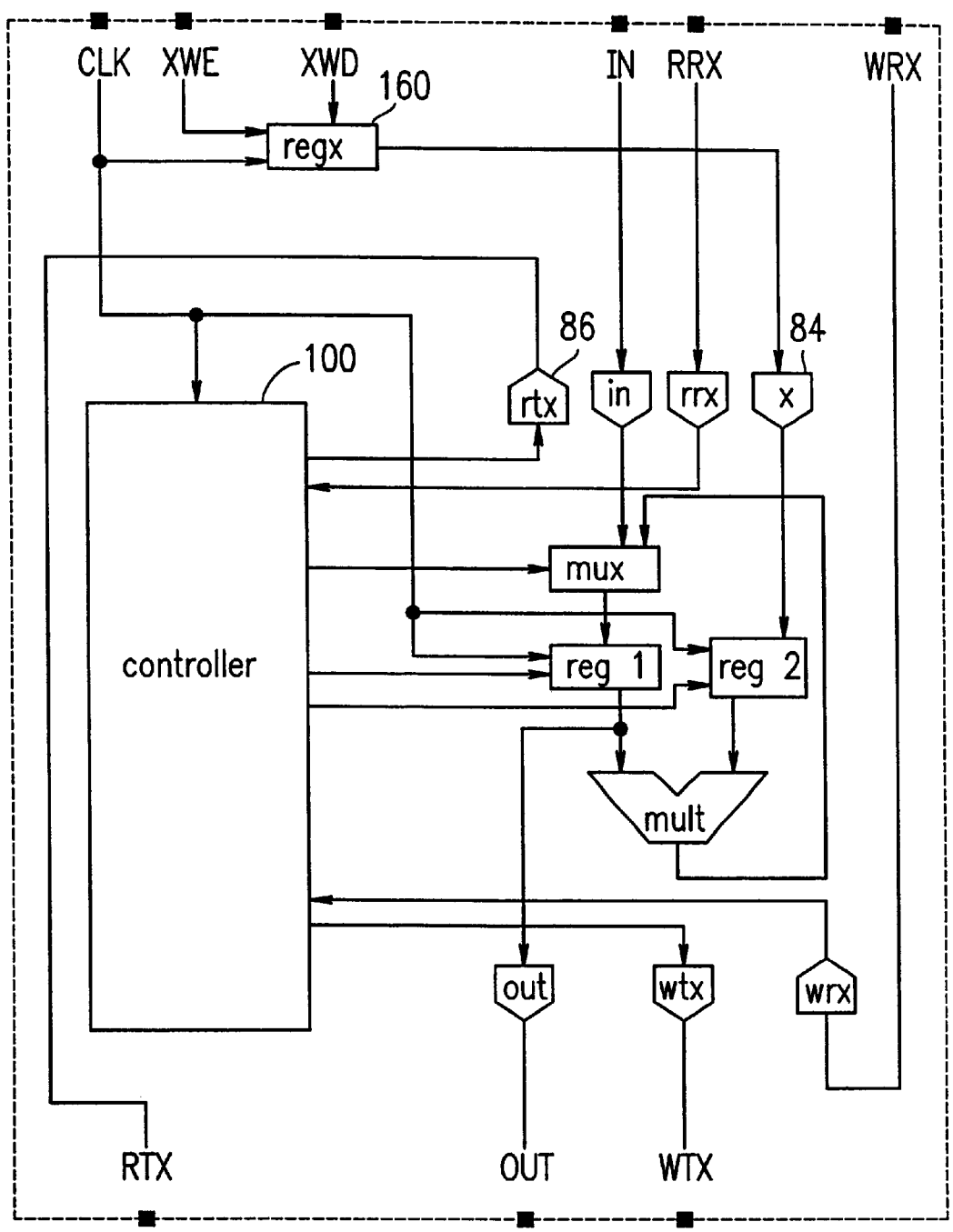
FIG. 16 is a circuit diagram showing an RT level circuit in which a register is added to an asynchronous channel in the circuit shown in FIG. 9.

In FIG. 2, the use of an asynchronous communication path x is declared. The asynchronous communication path x is implemented using a register regx 160 as shown in FIG. 16.

Figure 17:
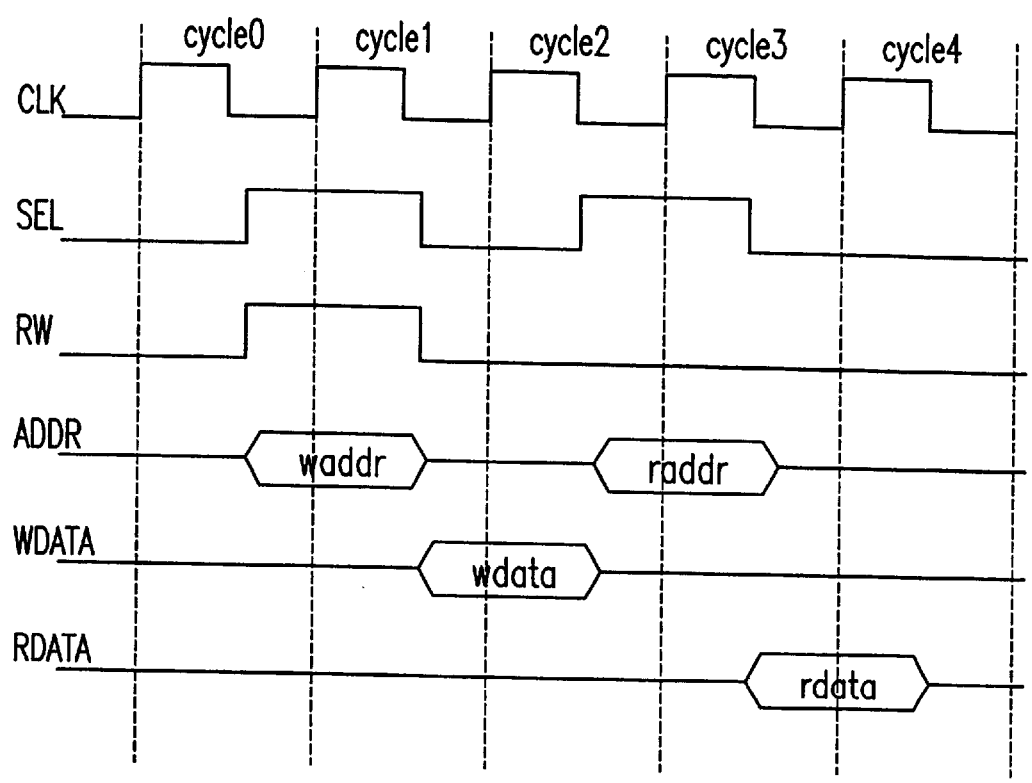
FIG. 17 is a diagram showing a timing specification of a bus stdbus.

Here, it is assumed that a bus stdbus is of a master-slave type, which includes a master and a slave which require bus connection; an interface circuit is synthesized in which a synthesized circuit is used as a slave; and the timing of a signal change viewed from the slave is predetermined as shown in FIG. 17. Specifications of the bus stdbus are the following specification (1) through (6).

(1) Input signals SEL, RW, ADDR, WDATA, and RDATA are values referenced at the rising of a clock signal CLK.

(2) A slave circuit is selected, and read and written when the slave selecting signal SEL is at HIGH level.

(3) The input signal RW represents the writing into a slave circuit when it is at HIGH level, and the reading from a slave circuit when it is at LOW level.

(4) The address signal ADDR represents an address in writing or reading.

(5) The write data signal WDATA represents write data into a slave circuit.

(6) The read data signal RDATA represents data read out from a slave circuit.

Thus, writing into or reading from the bus stdbus is performed followed by the selection of the bus stdbus. Therefore, a circuit whose timing is defined in advance is difficult to be described using the above-described conventional behavioral synthesis method.

The timing of the bus stdbus as shown in FIG. 17, and the above-described specifications (1) through (6), are registered in advance in the bus protocol library 11 shown in FIG. 1. The use of the bus stdbus is declared in what is extracted by the bus connection resource extracting section 4. Information on the type of the bus and a resource to be connected to the bus is saved in the bus connection resource database 5. The bus stdbus is selected from the bus protocol library 11, and the bus interface generating section 12 generates a bus interface circuit.

In step S10, the RT level circuit description generating and storing processes are executed. The RT level circuit description generating section 13 generates an RT level circuit description for an entire circuit included the generated bus interface circuit, and outputs the RT level circuit description to the RT level circuit description storing section 14. The RT level circuit description storing section 14 stores the RT level circuit description.

Figure 18:
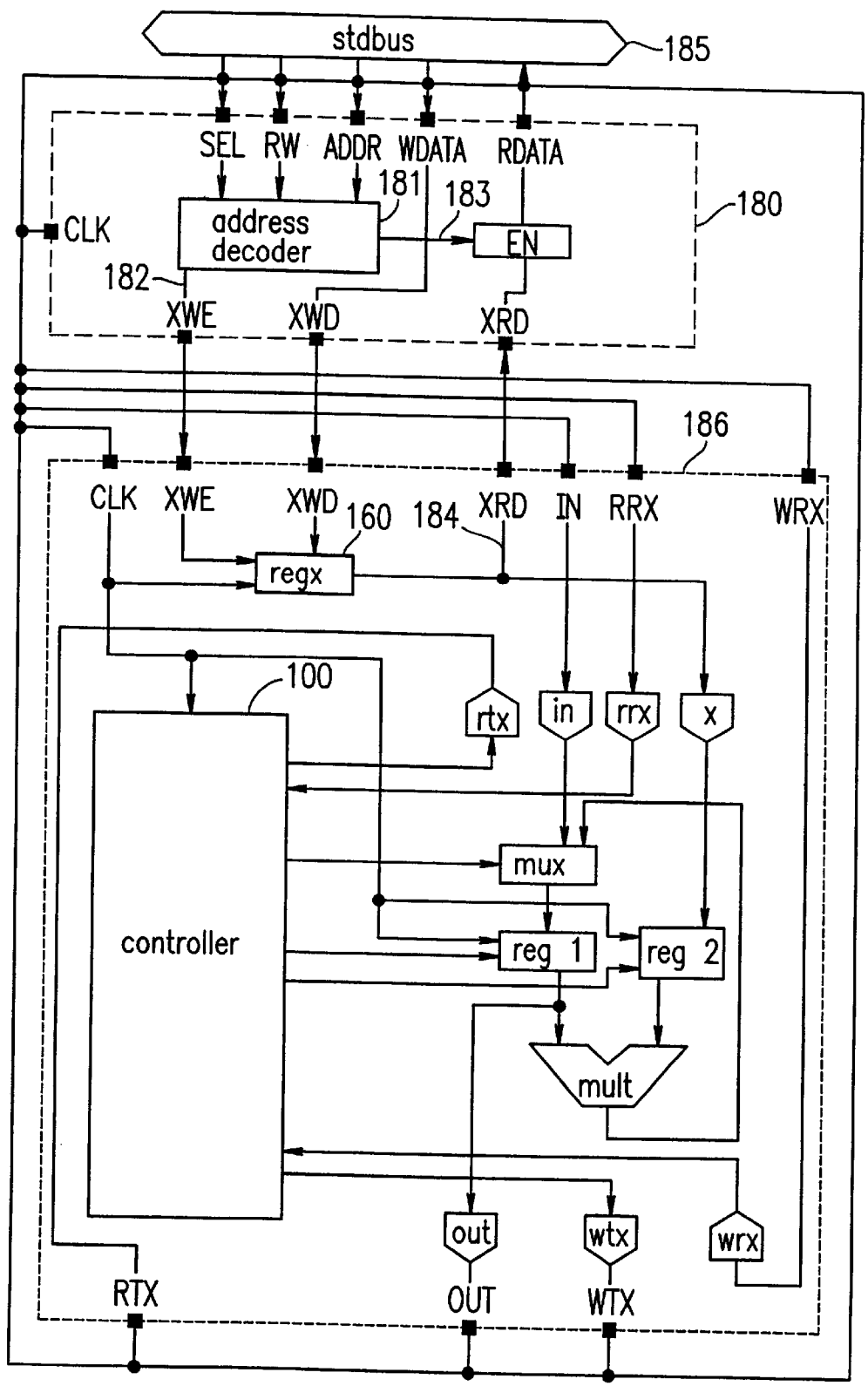
FIG. 18 is a circuit diagram showing an RT level circuit description for an entire circuit including an interface circuit, generated by an RT level circuit description generating section shown in FIG. 1.

FIG. 18 is a circuit diagram showing the generated circuit description for the entire circuit including the bus interface circuit. In FIG. 18, a bus interface circuit 180 is a portion surrounded by a thick dashed line, which is connected to a circuit portion 186 and a bus stdbus 185 except for the bus interface circuit 180. An address decoder 181 generates a write enable signal XWE 182 to a register regx 160, a slave selection signal SEL, an input signal RW, and an address signal ADDR, and also generates an output enable signal 183. Further, a read path 184 from the register regx is added in order to output a read data signal RDATA.

Figure 19:
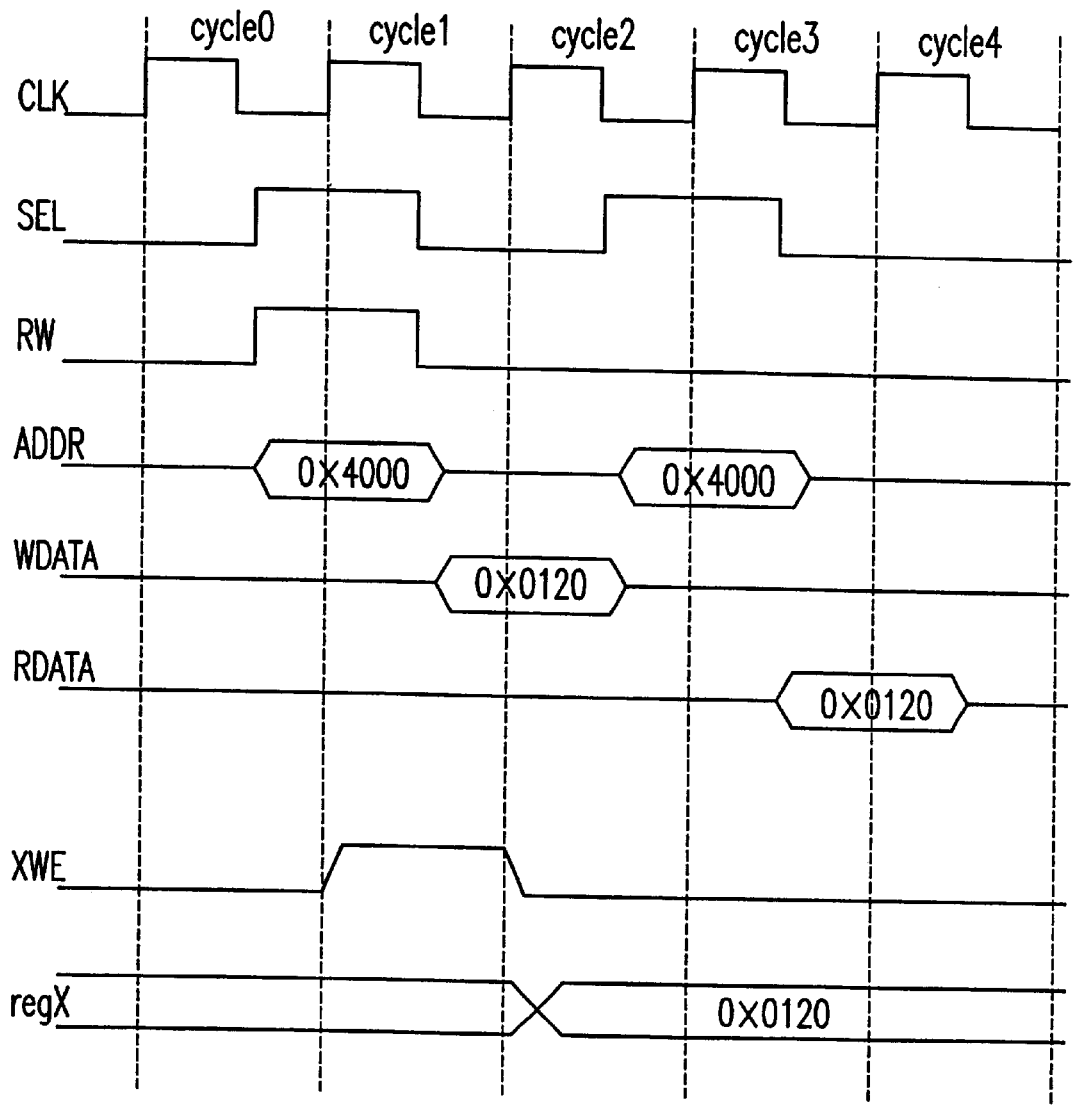
FIG. 19 is a diagram showing timing of data transfer to the bus stdbus shown in FIG. 18.

As a result, the generated bus interface circuit 180 works in the following manner. When the slave selection signal SEL and the input signal RW are at HIGH level, and the address signal ADDR represents an address of a bus at a rising edge of a clock, the write enable signal XWE 182 is set to be at HIGH level. Otherwise, the write enable signal XWE 182 is set to be at LOW level. As shown in FIG. 2, line 2, it is declared that the address of the bus is 0x4000. As shown in a timing flowchart in FIG. 19, the address signal ADDR represents that the address of the bus is 0x4000 starting from the latter half of a cycle cycle( ). The address signal ADDR is input to the address decoder 181 at the rising edge of a subsequent clock CLK. At a cycle cycle1, the write enable signal XWE 182 becomes HIGH level, and the write data signal WDATA having a value of 0x0120 is input to the register regx 160. The address signal ADDR represents that the address of the bus is 0x4000 starting from the latter half of a cycle cycle2. The address signal ADDR is input to the address decoder 181 at the rising edge of a subsequent clock CLK. Since the input signal RW is at LOW level, the register regx 160 having a value of 0x0120 is output to the data signal RDATA.

As described above, according to the present invention, an RT level circuit having the bus interface circuit 180 is synthesized based on a behavioral description including the use of a bus. Thereafter, the RT level circuit can be converted to a hardware circuit by synthesis using a commercially available logic synthesis tool.

In step S11, whether or not a general-purpose CPU is present in a system is determined. If a general-purpose CPU is not present in a system, the process is ended. If a general-purpose CPU is present in a system, a header file for preloaded software which is developed along with the designing of hardware is automatically generated, and a library function is automatically generated. Hereinafter, an example of the preloaded software header file generating and storing processes in step S12 and the preloaded software library function automatic generating and storing processes in step S13 will be described.

FIG. 20 is a diagram showing an exemplary behavioral description for a circuit including an ARM as a general-purpose CPU. A bus used is an AMBA bus. Similarly to FIG. 2, the behavioral description shown in FIG. 20 includes three functions, i.e., main( ), circuit( ), and testbench( ). The function circuit( ) is a function to be synthesized. The function testbench( ) is a testbench. In the function main( ), lines 25 and 26, a total of three communication paths, i.e., two synchronous communication paths used in communication with a general-purpose CPU, and an asynchronous communication path are declared. In the function circuit( ), a pragma amba_asb is used to designate a communication path and a memory used in data transfer to and from the outside. The synchronous communication path is used for handshake between a circuit( ) circuit and the general-purpose CPU. The asynchronous communication path and a memory are used for data transfer. Further, an address is allocated to each of the communication paths, the memory, and an interrupt signal in order to specify a communication path from the general-purpose CPU. For example, if addresses are allocated as shown in FIG. 21, the corresponding portion in the behavioral description shown in FIG. 20 is lines 33 to 35.

A behavior of the circuit( ) circuit to be synthesized in the behavioral description is the following.

The circuit( ) circuit to be synthesized waits until a transmission permission is issued from an ARM CPU. To this end, a function receive( ) is used as shown in FIG. 20, at line 9. When the ARM CPU issues the transmission permission, data is written to the asynchronous communication path data. When the writing of data is ended, send (bach_done, 1) is executed in order to inform the ARM CPU of completion of the transmission as shown in FIG. 20, at line 12. Here, send( ) does not wait for the completion of reception of the ARM CPU. Any value transmitted by send( ) is regarded as "1".

Thus, when the behavioral description in which an address is allocated to each of the communication paths and the memory is provided to the behavioral description storing section 2 (FIG. 1) of the present invention, an RT level circuit description including a bus interface circuit is generated by the RT level circuit description generating section 13, information on each resource is extracted by the bus connection resource extracting section 4, and a preloaded software header file is generated by the preloaded software header file generating section 15 as described above. In this situation, as shown in FIG. 22, when preloaded software using an ARM CPU which is a general-purpose CPU is generated, a header file defining each address is automatically generated at lines 1 to 3 in the software program in FIG. 22. A behavior of the preloaded software shown in FIG. 22 will be described below.

In the case of data transfer from the circuit( ) circuit to the ARM CPU, sync_send(ARM_READY) is executed to issue transmission permission to the circuit( ) circuit in order to inform the circuit( ) circuit of that the ARM CPU is in a receive-enable state as shown at line 5 in FIG. 22. Sync_send( ) is a library function, which waits until data at a designated address is "1". When the writing of the data is ended at the circuit( ) circuit side, the data read out as shown in FIG. 22, at line 8. When the reading of the data is ended, sync_send(ARM_READY) is executed in order to permit transmission of subsequent data to the circuit( ) circuit as shown in FIG. 22, at line 10. Since processing at the circuit( ) circuit side is typically earlier than execution of software by the ARM CPU, the ARM CPU issues transmission permission as early as possible.

In the preloaded software shown in FIG. 22, library functions, i.e., sync_send( ), etc., are used. A behavioral description in which a communication path used is declared as in a header file is provided to the behavioral description storing section 2 (FIG. 1), as described above, an RT level circuit including the bus interface circuit 180 is generated by the RT level description generating section 13, information on each communication path is extracted by the bus connection resource extracting section 4, the bus connection resource database 5 is referenced, and a preloaded software library function file is generated by the preloaded software library function generating section 17. The generated preloaded software library function is shown in FIG. 23. The preloaded software library function is filed in the preloaded software library function file 18.

As described above, according to this embodiment of the present invention, in high-level synthesis for synthesizing hardware from a behavioral description in which processing behaviors are described, a resource (a memory or a register) to be connected to a predetermined bus can be designated in the behavioral description and an interface circuit for performing data transfer between the bus and the resource in association with the input and output timings of the bus. Therefore, a bus interface circuit, which is conventionally designed by manual work, can be synthesized from a behavioral description into an RT level circuit. Therefore, it is easy to manage resources within a circuit, and errors which are inevitable in manual design are eliminated, whereby design quality is improved and a period of time for design is shortened.

Further, if a CPU is present in a system, hardware development and software development are conducted in parallel. Information on resources which are conventionally managed by manual work can be automatically managed by automatically generating a header file and a library function. Similarly, design quality is improved and a period of time for design is shortened.

As described above, according to the present invention, a bus connection resource database and a bus protocol library are referenced. Therefore, a bus interface circuit, which is conventionally designed by manual work, can be automatically synthesized. An RT level circuit of an entire circuit including the bus interface circuit can be synthesized based on a behavioral description. Therefore, it is easy to manage resources within a circuit, and errors which are inevitable in manual design are eliminated, whereby design quality is improved and a period of time for design is shortened.

According to the present invention, if a CPU is present in a system, a header file is automatically generated by referencing information on resources. The information on resources which are conventionally managed by manual work can be automatically managed, whereby design quality is improved and a period of time for design is shortened.

According to the present invention, if a CPU is present in a system, a library function is automatically generated by referencing information on resources. The information on resources which are conventionally managed by manual work can be automatically managed, whereby design quality is improved and a period of time for design is shortened.

A logic circuit configuration itself which is automatically constructed based on a behavioral description as design data with a high-level synthesis method in the high-level synthesis apparatus of the present invention will be implemented into actual hardware later. The method for producing a logic circuit using the high-level synthesis method for the logic circuit design also has the same effect as that of the present invention, although it is not described in the above-described embodiment.

A hardware architecture of the high-level synthesis apparatus of the present invention is not specifically described above, but includes an input section with which a user enter inputs (e.g., a keyboard and a mouse), a storage section in which a control program and data for controlling the high-level synthesis apparatus of the present invention (e.g., a RAM as a working memory and a ROM as a computer-readable recording medium), a database (e.g., the above-described databases 2, 5, and 11), and a control section which is controlled by an instruction input from the input section and drives the high-level synthesis apparatus (high-level synthesis method) of the present invention based on the control program stored in an ROM (e.g., CPU). The high-level synthesis apparatus further includes a display section for displaying a result of each process (e.g., a liquid crystal display and a CRT display).

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A high-level synthesis method for synthesizing a register transfer level logic circuit based on a behavioral description in which processing behaviors are described, the method comprising the steps of:
    extracting information on a bus connection resource from the behavioral description;
    storing the information on the bus connection resource in a bus connection resource database;
    referencing the bus connection resource database;
    referencing a bus protocol library having a preloaded bus protocol; and
    automatically generating a target interface circuit based on a result of each of the bus connection resource database referencing step and the bus protocol library referencing step.

2. A high-level synthesis method according to claim 1, further including referencing the bus connection resource database to automatically generate a preloaded software header file for a target bus.

3. A high-level synthesis method according to claim 2, further including referencing the bus connection resource database to automatically generate a preloaded software library function for a target bus.

4. A high-level synthesis method according to claim 1, further including referencing the bus connection resource database to automatically generate a preloaded software library function for a target bus.

5. A high-level synthesis method according to claim 1, wherein the information on the bus connection resource includes information on a communication path, a memory and a register to be connected to a bus.

6. A method for producing a logic circuit using a high-level synthesis method according to claim 1 in the logic circuit design.

7. A computer readable recording medium for storing a computer program for executing a high-level synthesis method according to claim 1.

8. A high-level synthesis method according to claim 1, wherein a bus interface generating section is provided for automatically generating the target interface circuit, the bus interface generating section including a bus connection resource database reading section, a bus protocol library reading section, a bus-side connecting circuit generating section, a user circuit-side connecting circuit generating section, and an address decoder generating section.

9. A high-level synthesis apparatus for synthesizing a register transfer level logic circuit based on a behavioral description in which processing behaviors are described, comprising:
    a bus connection resource extracting section for extracting information on a bus connection resource from the behavioral description;
    a bus connection resource database for storing the information on the bus connection resource;
    a bus protocol library for storing a bus protocol in advance; and
    a bus interface generating section for automatically generating a target interface circuit by referencing the bus connection resource database and the bus protocol library.

10. A high-level synthesis apparatus according to claim 9, further comprising:

a preloaded software header file generating section for automatically generating a preloaded software header file relating to a target bus by referencing the extracted information on the bus connection resource and the bus connection resource database.

11. A high-level synthesis apparatus according to claim 10, further comprising:

a preloaded software library function generating section for automatically generating a preloaded software library function relating to a target bus by referencing the extracted information on the bus connection resource and the bus connection resource database.

12. A high-level synthesis apparatus according to claim 9, further comprising:

a preloaded software library function generating section for automatically generating a preloaded software library function relating to a target bus by referencing the extracted information on the bus connection resource and the bus connection resource database.

13. A high-level synthesis apparatus according to claim 9, wherein the information on the bus connection resource includes information on a communication path, a memory and a register to be connected to a bus.

14. A high-level synthesis apparatus according to claim 9, wherein the bus interface generating section includes a bus connection resource database reading section, a bus protocol library reading section, a bus-side connecting circuit generating section, a user circuit-side connecting circuit generating section, and an address decoder generating section.

* * * * *